United States Patent
Gomez et al.

(10) Patent No.: US 9,424,946 B2
(45) Date of Patent: Aug. 23, 2016

(54) NON-VOLATILE BUFFERING TO ENABLE SLOPPY WRITES AND FAST WRITE VERIFICATION

(71) Applicant: Seagate Technology LLC, Cupertino, CA (US)

(72) Inventors: Kevin Arthur Gomez, Eden Prairie, MN (US); Michael Joseph Steiner, Saint Paul, MN (US); Mark Allen Gaertner, Vadnais Heights, MN (US); Ryan James Goss, Prior Lake, MN (US)

(73) Assignee: Seagate Technology LLC, Cupertino, CA (US)

( * ) Notice: Subject to any disclaimer, the term of this patent is extended or adjusted under 35 U.S.C. 154(b) by 275 days.

(21) Appl. No.: 13/762,806

(22) Filed: Feb. 8, 2013

(65) Prior Publication Data
US 2014/0226413 A1 Aug. 14, 2014

(51) Int. Cl.
*G11C 16/34* (2006.01)
(52) U.S. Cl.
CPC .................. *G11C 16/3454* (2013.01)
(58) Field of Classification Search
CPC .............. G11C 16/10; G11C 16/3459; G11C 16/3454; G11C 16/0483; G11C 12/1018; G11C 13/0064; G11C 13/0069; G11C 2207/2245; G06F 12/0864
USPC ............. 365/185.22, 185.09, 185.17, 185.33; 711/216, 103
See application file for complete search history.

(56) References Cited

U.S. PATENT DOCUMENTS

| | | | |
|---|---|---|---|
| 5,524,094 A * | 6/1996 | Nobukata et al. | 365/185.21 |
| 5,828,601 A * | 10/1998 | Hollmer et al. | 365/185.2 |
| 6,011,720 A | 1/2000 | Tanaka | |
| 6,408,374 B1 * | 6/2002 | Calamvokis et al. | 711/216 |
| 6,732,306 B2 * | 5/2004 | Dover et al. | 714/719 |
| 7,447,870 B2 | 11/2008 | Hsieh et al. | |
| 7,620,773 B2 | 11/2009 | Nicholson et al. | |
| 7,761,655 B2 | 7/2010 | Mizushima et al. | |
| 7,975,192 B2 | 7/2011 | Sommer et al. | |
| 8,464,135 B2 * | 6/2013 | Erez et al. | 714/773 |
| 8,918,580 B2 * | 12/2014 | Cheon | 711/103 |
| 8,982,602 B2 * | 3/2015 | Sunkavalli et al. | 365/148 |
| 9,076,530 B2 * | 7/2015 | Gomez | G11C 16/06 |
| 2006/0149902 A1 | 7/2006 | Yun et al. | |
| 2009/0198874 A1 | 8/2009 | Tzeng | |
| 2010/0088557 A1 | 4/2010 | Weingarten et al. | |
| 2010/0169743 A1 | 7/2010 | Vogan et al. | |
| 2011/0149657 A1 | 6/2011 | Haratsch et al. | |
| 2012/0005412 A1 | 1/2012 | Ware | |
| 2014/0108362 A1 * | 4/2014 | Kim et al. | 707/693 |
| 2014/0219034 A1 * | 8/2014 | Gomez et al. | 365/185.22 |

* cited by examiner

*Primary Examiner* — Andrew Q Tran
(74) *Attorney, Agent, or Firm* — Hall Estill Attorneys at Law

(57) ABSTRACT

Method and apparatus for managing data in a memory. In accordance with some embodiments, input write data having a selected logical address are stored in a rewriteable non-volatile (NV) buffer. A copy of the input write data is transferred to an NV main memory using a sloppy write process. A verify operation is subsequently performed to verify successful transfer of the copy of the input write data to the NV main memory using a hash value generated responsive to the input write data in the NV buffer.

9 Claims, 7 Drawing Sheets

NON-VOLATILE BUFFERING TO ENABLE SLOPPY WRITES AND FAST WRITE VERIFICATION

SUMMARY

Various embodiments of the present disclosure are generally directed to managing data in a data storage device.

In accordance with some embodiments, input write data having a selected logical address are stored in a rewriteable non-volatile (NV) buffer. A copy of the input write data is transferred to an NV main memory using a sloppy write process. A write verify operation is subsequently performed to verify successful transfer of the copy of the input write data to the NV main memory using a hash value generated responsive to the input write data in the NV buffer.

These and other features and aspects which characterize various embodiments of the present invention can be understood in view of the following detailed discussion and the accompanying drawings.

DETAILED DESCRIPTION

Figure 1:
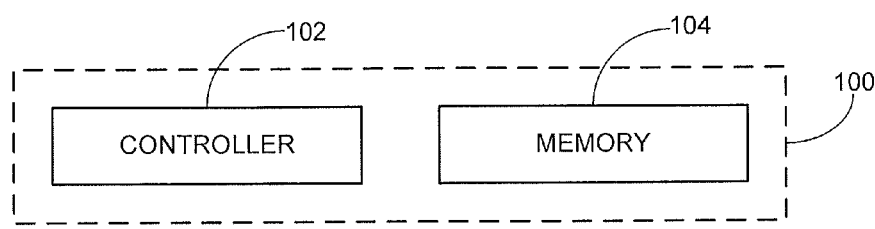
FIG. 1 provides is a functional block representation of a data storage device in accordance with various embodiments of the present disclosure.

The present disclosure generally relates to the management of data in a data storage device.

Non-volatile (NV) memories tend to store data in such a way that the stored data persist in the memory without the need for refresh operations to maintain the data state, such as after power is removed from the memory device.

A write verify operation (sometimes referred to as a write/read verify or simply verify operation) can be carried out to ensure data have been successfully written to a non-volatile memory during a write operation.

Generally, a verify operation can entail temporarily buffering the data in a local buffer memory, writing the data to a main memory so that the data are copied over from the local buffer to the main memory, reading a set of data from the main memory, and comparing the data read back from the main memory with the original set of data in the local buffer. If the two sets of data match, the write operation can be verified as having been successful, and the original set of data in the local buffer can be jettisoned or otherwise discarded to make room for other data.

If a power outage or other disturbance event occurs prior to the completion of the write verify operation, or if the data are corrupted or jettisoned from the local buffer prior to the write verify operation, the data may be lost if the write operation was unsuccessful. Because of these risks, it is common to employ a non-volatile (NV) local buffer to temporarily store high priority write data prior to transferring the data to an NV main memory.

Buffering the input data in an NV buffer essentially ensures that the data are always stored in NV memory, which tends to reduce the risk of data loss. Moreover, buffering the input data in an NV buffer allows a command complete status to be safely issued to the host device as soon as the data are received by the host, allowing the subsequent write operation to move the data to the NV main memory to be carried out at a more opportune time instead of requiring the write operation to be immediately serviced.

While operable, there remains a continued need for improvements in the manner in which write data are transferred to an NV main memory. Accordingly, various embodiments of the present disclosure are generally directed to enhancing data integrity and system reliability in a data storage system.

As explained below, various embodiments generally employ an NV main memory, such as a flash memory, to which user data from a host device are stored. An NV write buffer is used to temporarily buffer write data pending transfer to the main memory. The NV write buffer may take a non-flash NV construction such as magnetic random access memory (MRAM), spin-torque transfer random access memory (STRAM), resistive random access memory (RRAM), phase change random access memory (PCRAM), etc.

Incoming write data are stored in the NV write buffer, and a write operation is scheduled and performed to copy the write data from the NV buffer to the NV main memory. A sloppy write process may be used to transfer the write data to the NV main memory. A verify operation is scheduled to subsequently verify successful writing of the data to the NV main memory.

In some embodiments, a first hash value is generated responsive to the write data in the NV buffer. A read operation is performed to retrieve the written data copied to the NV main memory, and a second hash value is generated responsive to these retrieved data. The first and second hash values are compared, and if the hash values match, the first hash value is stored to the NV main memory.

When an updated set of the input write data are received having the same logical address as the initial write data, the first hash value is retrieved from the main memory and compared to a third hash value generated responsive to the updated set of the input write data. If the hash values match, the updated set of input write data is determined to be a duplicate set of data, and is jettisoned from the NV buffer. If the hash values do not match, the updated set of the input write data are written to the NV main memory as before.

In this way, the verify operation can be given low priority and performed at a convenient time. The use of hash values can improve the efficiency of both the write verify process as well as the efficiency of subsequent writes using data sharing a common logical address (such as a logical block address, LBA), thereby reducing write amplification.

These and other features and advantages of various embodiments can be understood beginning with a review of FIG. 1 which provides a data storage device 100 constructed and operated in accordance with various embodiments. The data storage device 100 generally includes a controller 102 and a memory module 104 (MEMORY). The controller 102 provides top level control of the device 100. The memory module 104 stores and retrieves user data from/to a requestor entity, such as an external host device (not separately shown). In some embodiments, the controller functionality can be incorporated into the memory module 104 so that a separate controller is unnecessary.

For purposes of providing a concrete example, the system 100 is contemplated as a flash memory based storage device, such as a solid state drive (SSD), a portable thumb drive, a memory stick, a memory card, etc. It will be appreciated that this is merely illustrative and not limiting, as the memory module 104 can alternatively incorporate any number of different types of non-volatile memory.

Figure 2:
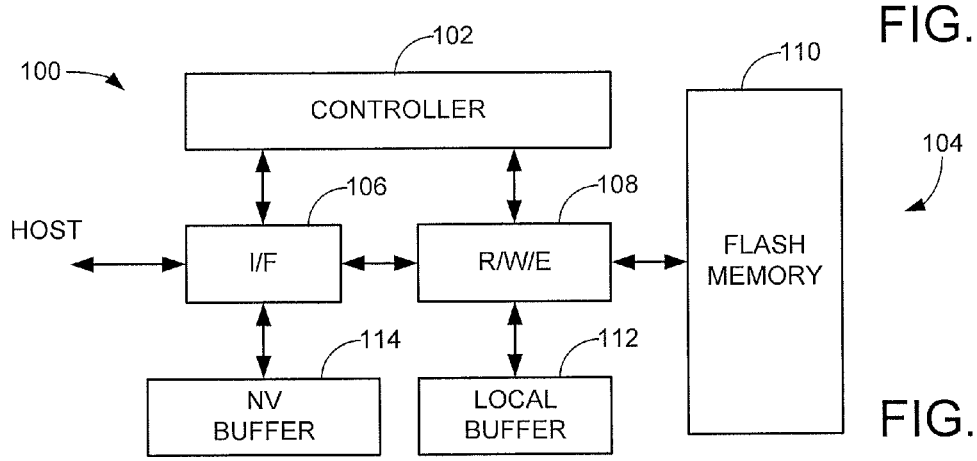
FIG. 2 illustrates aspects of the device of FIG. 1 in accordance with some embodiments.

FIG. 2 illustrates portions of the device 100 of FIG. 1 in accordance with some embodiments. The controller 102 is depicted as a programmable processor having suitable programming stored in local memory to direct data transfer operations with a host device. The memory module 104 includes an interface (I/F) circuit 106, a read/write/erase (R/W/E) channel 108, a flash memory array 110, a local volatile buffer 112 (LOCAL BUFFER), and a non-volatile (NV BUFFER) buffer 114.

The I/F circuit 106 provides primary interface communications with the host to receive and transmit commands, status control information and data. The R/W/E channel 108 includes suitable row and column drivers and other decoding circuit to encode, write and read back data from the flash memory array 110. The channel 108 carries out other operations under the direction of the controller 102 as well such as garbage collection, cache management and write verify operations.

The local buffer 112 may take the form of dynamic random access memory (DRAM) or similar construction and stores user data and metadata associated with the flash memory 110. The metadata may be stored in the flash memory array 110 and transferred to the local buffer 112 as necessary to support various access (read and write) operations.

The NV buffer temporarily stores write data pending write verify operations upon data copied over to the flash memory 110, as discussed below. It is contemplated that the NV buffer 112 is rewriteable so that data may be written to the buffer and then overwritten as required.

Figure 3:
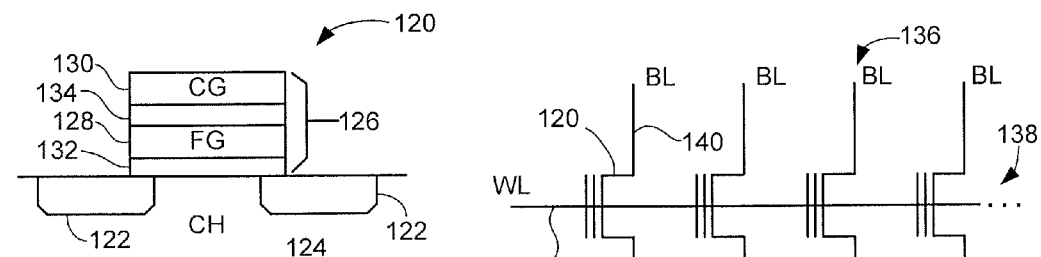
FIG. 3 depicts a flash memory cell from the flash memory of FIG. 2.

FIG. 3 depicts a flash memory cell 120 from the flash memory array 110. Doped regions 122 in a semiconductor substrate 124 form source and drain regions spanned by a gate structure 126. The gate structure includes a floating gate (FG) 128 and a control gate (CG) 130 separated by intervening barrier layers 132, 134. Data are stored to the cell 120 in relation to the accumulation of electrical charge on the floating gate 128.

Figure 4:
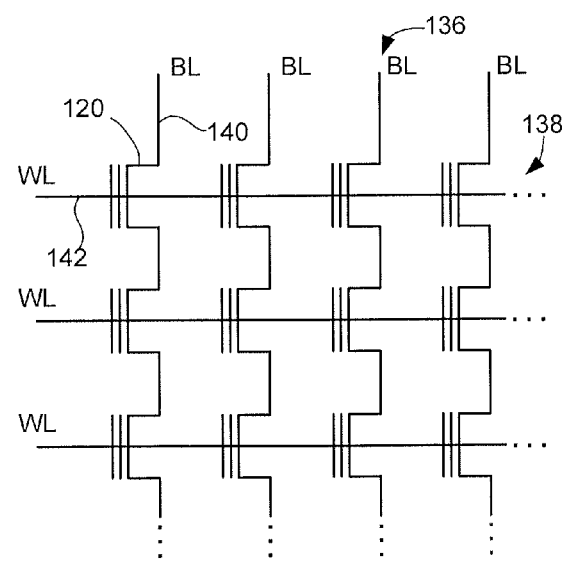
FIG. 4 schematically represents a portion of an array of flash memory cells in accordance with some embodiments.

FIG. 4 shows a plurality of the cells 120 arranged into columns 136 and rows 138. The cells 120 in each column 136 are interconnected in a NAND configuration and are accessed by a separate bit line (BL) 140. The cells 120 along each row 138 are connected to a separate word line (WL) 142 which interconnects the control gate (GC) 130 of each cell along the associated row.

The cells are written (programmed) by applying suitable voltages to the bit lines 140 and word lines 142 to migrate charge from the channel to the respective floating gates 128. The presence of charge on the floating gate 128 of a cell 120 increases the threshold voltage that needs to be placed on the control gate 130 to place the cell in a drain-source conductive state. The programmed states are read (sensed) by applying a succession of voltages to the respective bit lines 140 and word lines 142 to detect the threshold at which the cells are transitioned to a conductive state.

Figure 5:
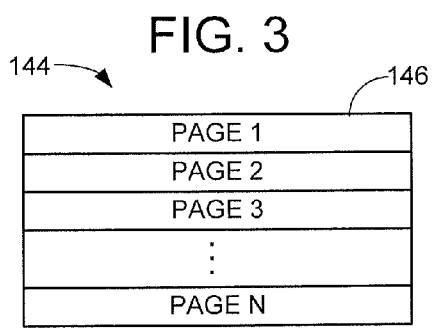
FIG. 5 depicts an erasure block of the flash memory array of FIG. 2.

A special erasure operation is required to remove the accumulated charge and return the cell 120 to an unerased, initialized state. FIG. 5 depicts an erasure block 144 formed from memory cells 120 as set forth by FIG. 4. The erasure block 144 represents the smallest grouping of memory cells that can be subjected to an erasure operation at a time.

The data are stored in the form of pages 146. The erasure block 144 has a total of N pages, with each page storing a selected amount of data (e.g., 4096 bits, etc.). The pages 146 correspond to the rows 136 of memory cells; in single level cell (SLC) recording, each cell 120 along a selected row stores a single page worth of data. In multi-level cell (MLC) recording, each cell 120 along a selected row stores two (or more) pages worth of data. Generally, each cell can store up to N bits of data by providing $2^N$ distinct accumulated charge levels.

Because data cannot normally be overwritten to a group of flash memory cells 120 without first subjecting the cells to an erasure operation, each set of data associated with a selected logical address (e.g., a logical block address, LBA, etc.) is normally written to a new location in the array. For example, a data block identified as LBA X may be written to Page 1 in FIG. 5. If a subsequently presented version of the data block LBA X is provided for writing, it may be written to a new location (e.g., Page 3, etc.). Generally, a next available location in the array 110 is selected to write each new version of a given LBA. The next available location may be in the same erasure block 144, or more likely, in a more recently allocated erasure block 144.

The metadata is maintained by the device 100 to track the locations of the various versions of each LBA. The metadata may include a series of forward pointers to manage the location of the most current version of each LBA. Prior versions may be marked as stale. When sufficient levels of data are stale in an erasure block or in a larger garbage collection unit (GCU) made up of a number of such blocks, the erasure block or GCU can be subjected to a garbage collection process whereby current version data are migrated to a new location, the erasure block or GCU is erased, and the erased block or GCU is returned to an allocation pool pending allocation for subsequent use in storing user data.

As noted above, the NV buffer 114 in FIG. 2 is used to temporarily buffer input write data to be written to one or more pages 146 in the array 110. Albeit not required, it is contemplated that the NV buffer 114 will use a different type of solid-state non-volatile memory cell construction. A variety of constructions can be used, such as but not limited to those set forth by FIGS. 6-8.

Figures 6, 7, 8:
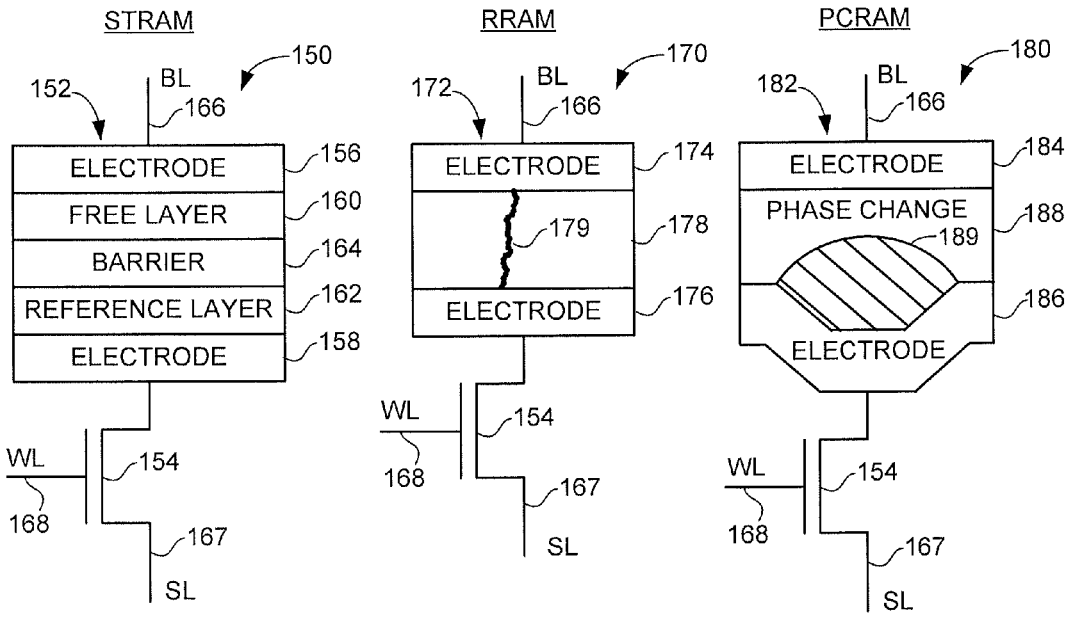
FIG. 6 represents a spin-torque transfer random access memory (STRAM) cell useful in the non-volatile (NV) write buffer of FIG. 2.
FIG. 7 illustrates a resistive random access memory (RRAM) cell useful in the non-volatile (NV) write buffer of FIG. 2.
FIG. 8 depicts a phase change random access memory (PCRAM) cell useful in the non-volatile (NV) write buffer of FIG. 2.

FIG. 6 depicts a memory cell 150 having a spin-torque transfer random access memory (STRAM) configuration. The memory cell includes a magnetic tunneling junction (MTJ) 152 in series with a switching device 154. The switching device 154 is shown to constitute a metal oxide semiconductor field effect transistor (MOSFET), although other forms of switching devices can be used including unidirectional devices such as diodes, etc.

The MTJ 152 includes top and bottom conductive electrodes 156 and 158, a free layer 160, a reference layer 162 and an intervening barrier layer 164 (BARRIER). Other MTJ configurations can be used. The free layer 160 comprises one or more layers of magnetically responsive material with a variable magnetic orientation. The reference layer comprises one or more layers of magnetically responsive material with a fixed magnetic orientation. The reference layer may include a pinning layer, such as a permanent magnet, a synthetic antiferromagnetic (SAF) layer, etc., and a pinned layer, such as a ferromagnetic layer oriented magnetically by the pinning layer. The direction(s) of the magnetic orientation may be perpendicular or parallel to the direction of current through the MTJ 152.

The MTJ exhibits different electrical resistances in relation to the orientation of the free layer 160 relative to the reference layer 162. A relatively low resistance is provided in a parallel orientation, where the free layer 160 is oriented in the same direction as the reference layer 162. A relatively high resistance is provided in an anti-parallel orientation, where the free layer 160 is oriented in the opposing direction as the reference layer 162. Spin torque currents can be applied to transition the free layer between the parallel and anti-parallel orientations.

The memory cell 150 is interconnected by a plurality of control lines, including a bit line (BL) 166, a source line (SL) 167 and a word line (WL) 168. The word line 168 operates as a select line, enabling current to pass through the MTJ 152 between the bit line 166 and the source line 167 in the desired direction.

FIG. 7 provides a resistive random access memory (RRAM) cell 170. The cell 170 includes an RRAM programmable element 172 in combination with the switching device 154 from FIG. 6. Top and bottom conductive electrodes 174, 176 separate an intervening layer that may constitute an oxide layer or electrolytic layer. The intervening layer 178 normally has a relatively high electrical resistance.

During a programming operation, ionic migration is initiated which may result in the formation of a filament 179 that lowers the electrical resistance through the RRAM element 172. The filament 179 is formed by applying a programming current sequence to the respective word, bit and source lines 166, 167 and 168. The RRAM cell 170 can be reset to its initial state by applying a different combination of voltages to the cell. Other RRAM configurations are contemplated that do not necessarily form a conductive filament, such as structures that undergo a change of state by the migration of ions or holes across a barrier or to an intermediate structure that results in a controlled change in resistance for the element 182.

FIG. 8 depicts a phase change random access memory (PCRAM) cell 180. As before, the cell 180 has a programmable element 182 in series with the switching device 154 from FIGS. 6-7. Top and bottom electrodes 184, 186 separate a phase change material 188. The phase change material is heat responsive and transitions (melts) when heated to a temperature at or above its glass transition temperature. Depending on the rate at which the layer 188 is subsequently cooled, at least a portion of the material can take an amorphous or crystalline state, with respective higher and lower resistances. FIG. 8 shows an amorphous zone 189 indicating the cell 180 is programmed to the high resistance state.

Figures 9, 10:
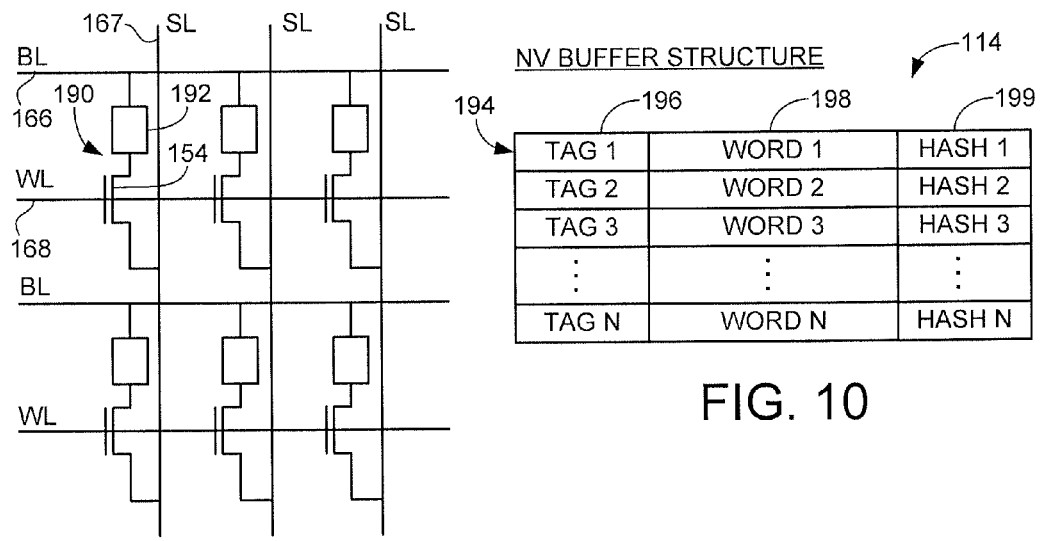
FIG. 9 is a schematic representation of an arrangement of rewriteable non-volatile memory cells of the NV buffer in accordance with some embodiments.
FIG. 10 provides an exemplary format for the NV buffer using rewriteable memory cells as arranged in FIG. 9.

It will be appreciated that other forms of non-volatile solid-state memory cells can be utilized apart from those exemplified in FIGS. 6-8. FIG. 9 shows the general use of NV memory cells 190 each having a resistive sense element (RSE) 192, which may correspond to a selected one of the elements 152, 172 and 182 in FIGS. 6-8, in combination with a switching device such as the device 154. The cells are arranged into rows and columns and interconnected via the aforementioned bit, source and word lines 166, 167 and 168.

Although not required, it is contemplated that the NV buffer 114 in FIG. 2 will take a construction such as set forth in FIG. 9. The NV buffer 114 will be rewritable in nature so that each set of cells along each word line 168 can be arranged to store data pending transfer to the main flash memory 110, and then overwritten with new data as required without the need to subject the memory to an erasure operation.

The NV buffer 114 may have a faster data I/O rate than the flash memory 110, so that data can be quickly written to and read out of the NV buffer 114 as required to support access operations with the flash memory. The NV buffer 114 may be arranged in the form of a content addressable memory (CAM) or similar cache structure. FIG. 10 shows an exemplary CAM structure for the NV buffer 114. The CAM structure can store up to N entries 194. Each entry includes an identifier tag in a tag field 196, a word payload in a word field 198 and, as desired, a hash payload in a hash field 199. The identifier tags may be LBA addresses for the blocks of user data. The word payloads may correspond to user data associated with the LBA address. The hash values can be generated and used for fast write verify and write amplification reduction, as explained below.

Figure 11:
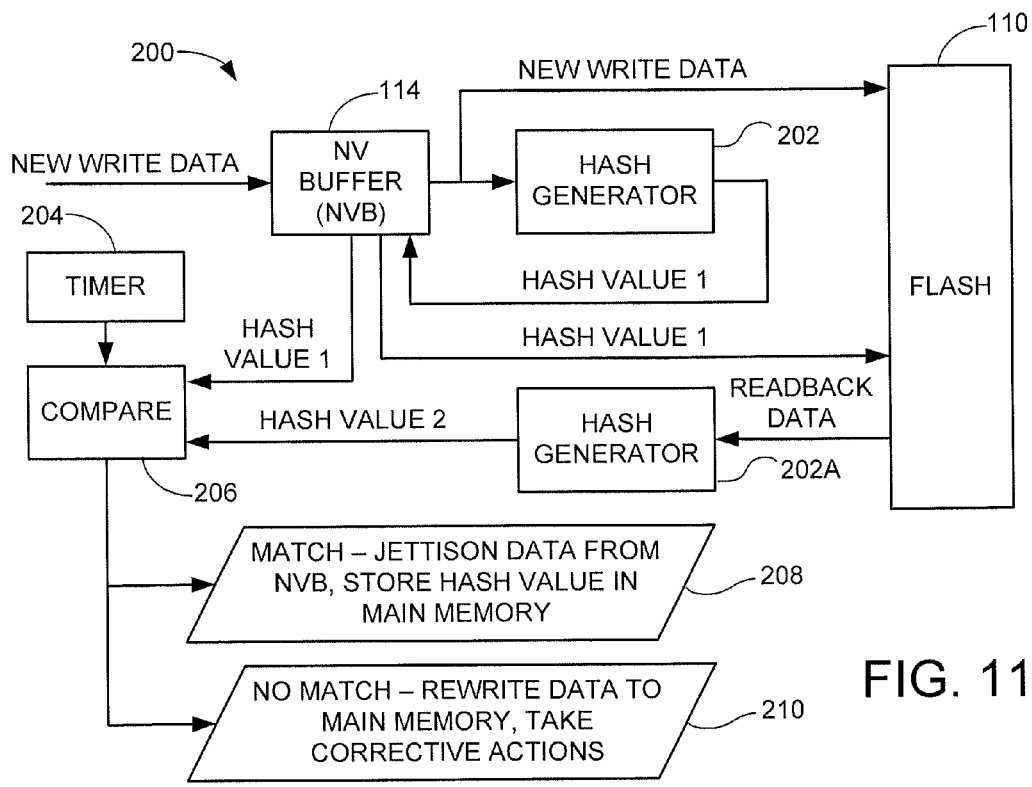
FIG. 11 illustrates an exemplary write verify operation for new write data carried out by the device of FIG. 2 in accordance with some embodiments.

FIG. 11 illustrates aspects of a data write management circuit 200 of the present disclosure. The circuit 200 can be incorporated into various aspects of the memory module 104 discussed above to carry out write verify and other related operations. For purposes of the present discussion, it will be contemplated that a new set of write data is presented to the device 100 from the host for writing to the main flash memory array 110 (FLASH), as illustrated by the WRITE DATA flowing from between the NVD 114 and the hash generator 202. The write data are provided with a selected logical block address, e.g., LBA 1001. In practice, it will be appreciated that a single write request (write command) can be issued that involves the writing of many LBAs worth of data to the flash memory.

As shown in FIG. 11, the write data received from the host are temporarily stored in an available entry 194 (FIG. 10) of the NV buffer 114. Encoding may be applied prior to or subsequent to the loading of the write data to the NV buffer 114.

The writing of the data to the flash memory array 110 may include referencing the metadata to identify a physical address (e.g., page, etc.) to which the data are to be written, and to apply the appropriate encoding or other processing to the data to store the data. The data will be stored to a selected row 138 of the flash memory cells 120 in relation to the amount of accumulated charge on the associated floating gates 128 of the cells. A fast (sloppy) write process may be carried out to transfer the data to the flash memory 110, as discussed in greater detail below.

In conjunction with the data write process, a hash generator circuit 202 (HASH GENERATOR) uses a selected hash function to generate a first hash value (hash value 1) based on the write data in the NV buffer 114. The hash value may be formed based on the user data stored in the payload field 198. The hash value may additionally be formed using the LBA value in the tag field 196, or other data. The generated hash value may be stored in the hash field 199 of the associated entry 194 in the NV buffer 114.

A hash function can be characterized as any number of different types of algorithms that map a first data set (a "key") of selected length to a second data set (a "hash value") of selected length. In many cases, the second data set will be shorter than the first data set. The hash functions used by the hash generator 202 should be transformative, referentially transparent, and collision resistant.

Transformation relates to the changing of the input value by the hash function in such a way that the contents of the input value (key) cannot be recovered through cursory examination of the output hash value. Referential transparency is a characteristic of the hash function such that the same output hash value will be generated each time the same input value is presented. Collision resistance is a characteristic indicative of the extent to which two inputs having different bit values do not map to the same output hash value. The hash function or functions used by the hash generator 202 can take any number of forms, including checksums, check digits, fingerprints, cryptographic functions, parity values, etc.

In some embodiments, a Sha series hash function, such as a Sha 256 hash is applied. Selected bits of the Sha 256 hash, such as the least significant bits of the Sha hash value, etc., can also be used as the hash value.

Continuing with FIG. 11, a write verify operation is next scheduled by the circuit 200. This may take place by initiating a timer 204 which measures a predetermined elapsed time interval, and performing the verify operation once the elapsed time interval is concluded. The use of the timer 204 is optional, but advantageously provides a minimum length delay before the write verify operation is conducted, allowing other operations to occur in the interim. Read requests for the write data (e.g., LBA 1001) can be satisfied as a cache hit from the NV buffer 114 during the interim. Receipt of a new set of updated write data during the interim for the same LBA(s) can potentially eliminate the need to perform the write verify operation if different, updated data are received.

It will be noted that the timer can count to a preselected number to denote the passage of a selected amount of time for the elapsed time interval (e.g., 30 seconds, 2 minutes, etc.). Alternatively, the timer can count intervening access commands (e.g., X commands such as 10 read and/or write commands, Y write commands, etc.) and base the interval on workload. In other embodiments, the verify operation is scheduled at some point in the future based on workload or other factors once the elapsed time interval has been concluded.

At such time that the circuit 200 proceeds with the verify operation, a copy of the input write data is read back from the flash memory array 110, and provided to a second hash generator block 202A (HASH GENERATOR). The second hash generator block 202A may be the same, or a different block, as required. The second hash generator block 202A uses the same hash function(s) as the hash generator block 202 to generate a second hash value (hash value 2).

A comparator circuit 206 (COMPARE) compares the first and second hash values. A variety of different process paths may be taken, depending on the results of the comparison operation. When the two hash values match, as indicated at 208, the write verify operation is determined to have been successful. The first hash value stored in the NV buffer 114 is transferred to the flash memory array 110 and associated with the rest of the input write data that were written previously. The hash value can be stored in the same location as the rest of the input write data, or the hash value can be stored elsewhere, including in a separate, specially configured erasure block or garbage collection unit (GCU) dedicated to this purpose. The hash value may alternatively become a portion of the metadata associated with the written data.

Because the verify operation was successful, the input write data are no longer needed and may be jettisoned from the NV buffer 114 to make room for new data. It will be appreciated that if the cache entry 194 occupied by the input write data is not immediately required for the storage of new data, the data may be scheduled for removal later as needed. Indeed, depending on workload, the data may remain until that space in the buffer is required for the caching of new data.

As indicated at step 210, when the two hash values (hash value 1 and hash value 2) do not match, an error is presumed to have occurred and the write data in the NV buffer 114 is rewritten to a new location in the flash memory array 110. Various corrective actions may be taken at this point to assess the flash memory array, including an investigation to determine whether a defect or other anomalous condition has arisen with respect to the location in flash where the data were previously stored.

Figure 12:
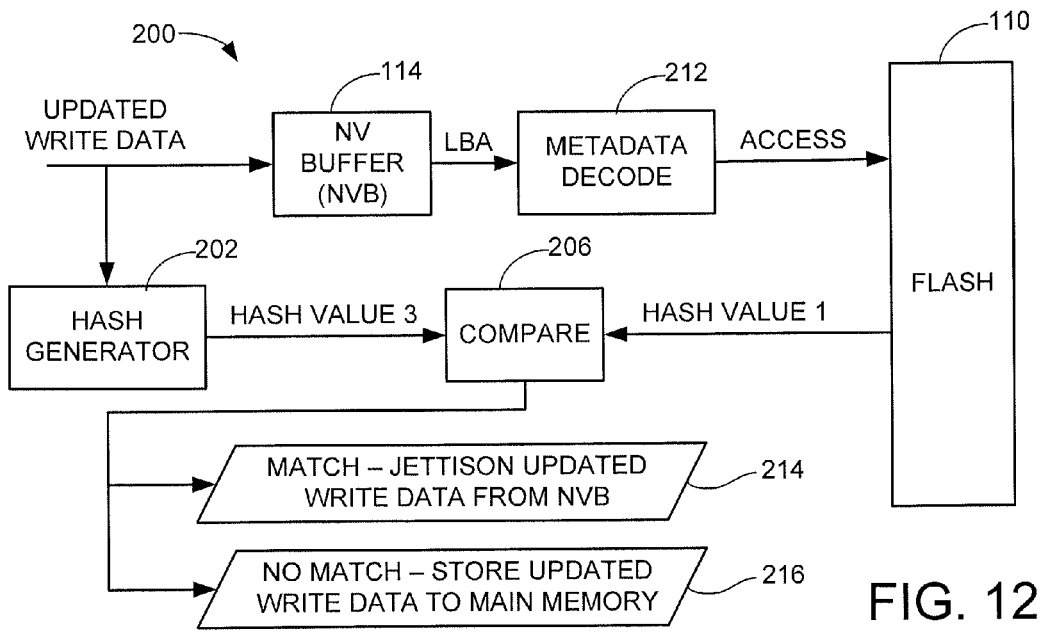
FIG. 12 depicts a subsequent write verify operation for updated write data carried out by the device of FIG. 2 in accordance with some embodiments.

FIG. 12 depicts a subsequent operation by the circuit 200 to process updated write data after the successful writing of data in FIG. 11. It is presumed in FIG. 12 that a new, updated set of write data for the same LBA (e.g., LBA 1001) is presented for storage by the host. As before, the data are stored in the NV buffer 114 pending transfer to the flash memory array 110 (FLASH).

A metadata decode block 212 (METADATA DECODE) accesses the metadata associated with the LBA of the input write data to locate the previously stored first hash value (hash value 1). The hash value 1 is read back from the array 110 and presented to the comparison circuit 206 (COMPARE). Concurrently, the hash generator 202 (or 202A), which are individually shown as HASH GENERATOR, uses the updated write data to generate a third hash value (hash value 3) and presents the same to the comparison circuit 206. As before, a number of different process paths are contemplated.

As shown at 214, if the hash values (hash value 1 and hash value 3) match, this indicates that the updated write data are a duplicate copy of the previously stored data. The storage of the write data to the flash memory array 110 would result in unnecessary write amplification, and therefore the updated write data are jettisoned from the NV buffer 114.

Contrawise, if the hash values (hash value 1 and hash value 3) do not match, this indicates that the updated write data are different from the previously stored data, and the updated write data are written to the flash array 110 and write verified as generally set forth above in FIG. 11. The new hash value (hash value 3) will be written to the array and associated with the updated write data, as discussed above.

Figure 13:
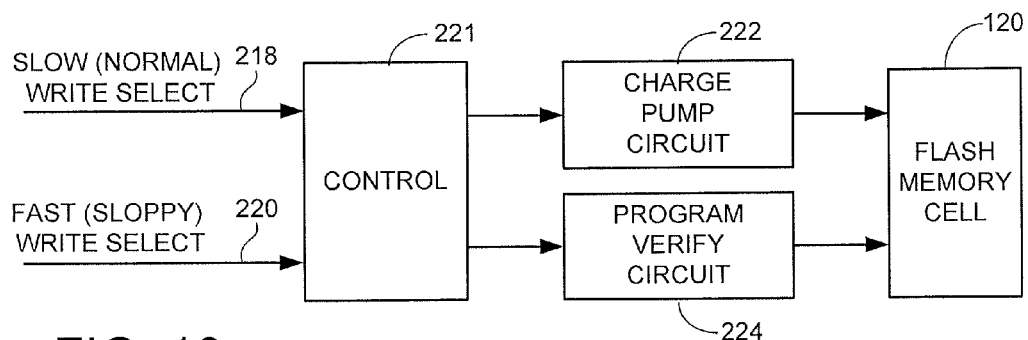
FIG. 13 represents the use of different write modes for data in accordance with some embodiments.

FIG. 13 illustrates aspects of the R/W/E channel 108 in some embodiments. The channel 108 is configured to write data in accordance with different operational modes: a slow (normal) write select mode, indicated by signal path 218; and a fast (sloppy) write select mode, indicated by signal path 220. The respective selection signals can be provided by the circuit 200 of FIGS. 11-12 during the writing of data to the flash memory array 110. The default setting is the slow (normal) write process.

The circuit 108 is further shown in FIG. 13 to include a main control circuit 221 (CONTROL), a charge pump circuit 222 and a program verify circuit 224. The charge pump circuit 222 generally operates to transfer quanta of charge to the associated flash memory cell 120 being programmed. The program verify circuit 224 periodically applies a read verify threshold to assess the total amount of charge that has been accumulated onto the floating gate 128 (FIG. 3) of the cell 120.

In the slow (normal) write select mode, the circuits 222, 224 operate in a normal fashion to apply charge to the flash memory cell. In some cases, this may include the accumulation of charge from a voltage source onto a storage device, such as a capacitor, and the transfer of the charge to the cell 120 via the associated bit and word lines (FIG. 4) to incrementally increase the amount of accumulated charge on the floating gate. The program verify circuit may operate at the conclusion of each charge transfer operation to assess the total amount of accumulated charge by the cell 120. A first, normal set of process parameters, such as thresholds, may be applied to ensure the total amount of charge on the programmed cell falls within a selected range.

During the fast (sloppy) write select mode, the circuits 222, 224 operate as above, except in a faster, less controlled manner. A number of techniques can be applied to speed up the programming process at the expense of precision. The charge pump circuit, for example, can be configured to transfer greater amounts of charge during each transfer than during the normal operation, and/or can transfer a larger number of charge sets in succession before being evaluated by the program verify circuit 224.

The program verify circuit 224 may use a second set of relaxed parameter thresholds when adjudging whether the programming operation has been completed. It is contemplated that the sloppy write process will tend to write data faster than the normal write process, and potentially with a lower draw of overall power, but the finally programmed cells will tend to exhibit greater charge distribution variations as compared to the same cells programmed using the normal process. Aspects of both the charge pump circuit 222 and the program verify circuit 224 will be presented in greater detail below.

Figure 14:
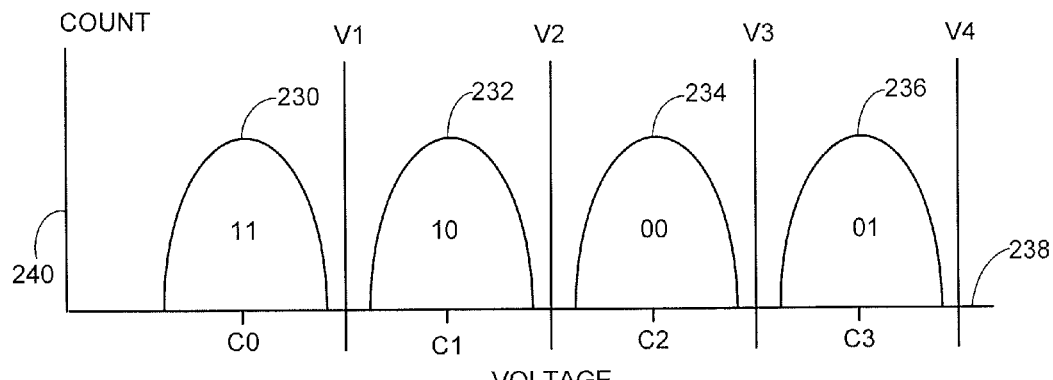
FIG. 14 graphically represents different charge distributions for a population of flash memory cells.

FIG. 14 provides a sequence of normalized charge distributions 230, 232, 234 and 236 for a population of flash memory cells 120 programmed as multi-level cells (MLCs). The distributions are plotted against a common x-axis indicative of voltage magnitude and a common y-axis 160 indicative of cell population count (COUNT).

The distributions 230-236 represent variations about nominal accumulated charge states $C0<C1<C2<C3$, and correspond to MLC programmed states 11, 10, 00 and 01. Other encoding schemes can be used. Distribution 230 represents variation in the amount of charge on the memory cells in the array that have been programmed to the state 11, distribution 232 corresponds to state 10, distribution 234 corresponds to state 00, and distribution 238 corresponds to state 01. The cells in population 236 have the most accumulated charge and the cells in population 230 have the least accumulated charge.

The programmed states 11, 10, 00 and 01 may represent data for two different pages (blocks) of data in each cell in MLC mode. In this case, the least significant bit (LSB) of the programmed state provide a bit value for a first page, and the most significant bit (MSB) of the programmed state provide a bit value for a second page.

The respective charge distributions 230-236 are ideally non-overlapping to allow the application of suitable read-threshold voltages V1, V2, V3 and V4 to differentiate between the various programmed states. Threshold V1 nominally provides a voltage level sufficient to place all of the memory cells in distribution 230 into a source-drain conductive state, but insufficient to place the cells in the remaining distributions 232-236 into a conductive state. The threshold V4 is generally large enough to place all of the cells in a conductive state irrespective of their programmed state.

The programmed state of a selected flash memory cell can be read by placing the bit line 140 (FIG. 4) for the selected cell at a suitable forward voltage (e.g., +3V, etc.), and placing the remaining non-selected bit lines at some other lower reference voltage (e.g., 0V). The non-selected word lines 142 for rows not containing the selected cell can be placed at the highest threshold V4, so that all of the cells in the selected column other than the selected cell are placed in a source-drain conductive state.

One or more read-threshold voltages can be thereafter applied to the WL 142 associated with the selected cell 120, and the programmed state of the selected cell can be determined in relation to whether current flows through the bit line 140 and the other cells in the selected column. The read operation thus assesses whether a given read-threshold voltage is sufficient to place the selected cell in a conductive state; the higher the applied voltage required to obtain current flow through the column, the higher amount of accumulated charge is present on the floating gate.

In some embodiments, a first page of data is written to the cells along a selected row of cells in SLC mode. The first page of data will constitute a bit sequence of logical 0s and 1s in some order (e.g., 00101111010000100 . . . ). One bit will be stored in each cell. Those cells in which a logical 1 is to be stored may receive no programming effort (or minimal programming effort) so as to have a charge level that falls within the "11" distribution 230. Those cells in which a logical 0 is to be stored will receive sufficient programming effort to raise the charge level to fall within the "00" distribution 234.

To read back the stored bit sequence from the SLCs, the read threshold voltage V2 can be applied to each cell in turn, and the stored state (logical 1 or 0) can be determined in relation to whether the cell is placed into a conductive state as a result of the applied read threshold voltage.

A second page of data may be subsequently overwritten to the SLC cells to convert the cells into MLC form. As before, the second page of data will constitute a bit sequence of logical 0s and 1s, and one bit from the second page of data will be stored to each cell. Those cells to which a logical 1 is to be stored will receive no additional programmed effort. Those cells to which a logical 0 is to be stored will receive sufficient additional charge to increment the charge level to the next higher distribution.

If a logical 1 is to be written to a memory cell programmed in the "11" distribution 230, the additional charge will transition the cell to the "10" distribution 232. Similarly, if a logical 1 is to be written to a memory cell programmed in the "00" distribution 234, the additional charge will transition the cell to the "01" distribution 236. In each case, the LSB of the programmed cell (rightmost bit) indicates the bit value for the first page of data and the MSB of the programmed cell (leftmost bit) indicates the bit value for the second page of data.

It is contemplated that the slow (normal) write select mode of FIG. 13 will nominally provide relatively well defined and centered charge distributions as set forth by FIG. 14. That is, normal processing will generally tend to provide well controlled charge levels with sufficient separation margin to enable the reliable recovery of the written data. The fast (sloppy) write select mode of FIG. 13, however, may tend to increase the amount of variation in various charge distribution populations, thereby reducing the available margin in at least some cases.

Figure 15:
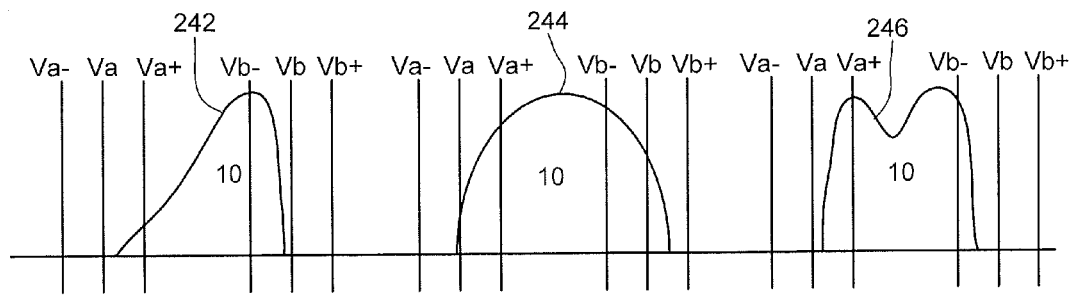
FIG. 15 depicts exemplary variations in charge distributions arising from the use of normal and sloppy writes.

FIG. 15 shows a succession of exemplary charge populations 242, 244 and 246 of the type that may arise using fast (sloppy) writes. The populations in FIG. 15 are merely exemplary and are not limiting, as the population characteristics will depend on the process parameters employed during the writing of the data to the memory cells. FIG. 15 provides a skewed distribution at 242, a substantially Gaussian but wider distribution at 244 and a multi-modal distribution at 246. For purposes of comparison to FIG. 14, each of the distributions 242, 244 and 246 are intended to represent an exemplary population of cells written to a charge state of 10.

Various lower sense thresholds Va, Va−, Va+ and upper sense thresholds Vb, Vb− and Vb+ are also depicted in FIG. 15. The baseline thresholds Va and Vb may correspond to the thresholds V1 and V2, or may be some other suitable values. The incremental thresholds Va−, Va+, Vb− and Vb+ are some selected interval from the baseline thresholds (such as +/− 10%, etc.). The various thresholds can be used to assess the characteristics of the respective distributions. Different sets of thresholds may be applied depending on whether the cells are written using the normal write select process as in, e.g., FIG. 14, or written using the fast write select process as in, e.g., FIG. 15.

Figure 16:
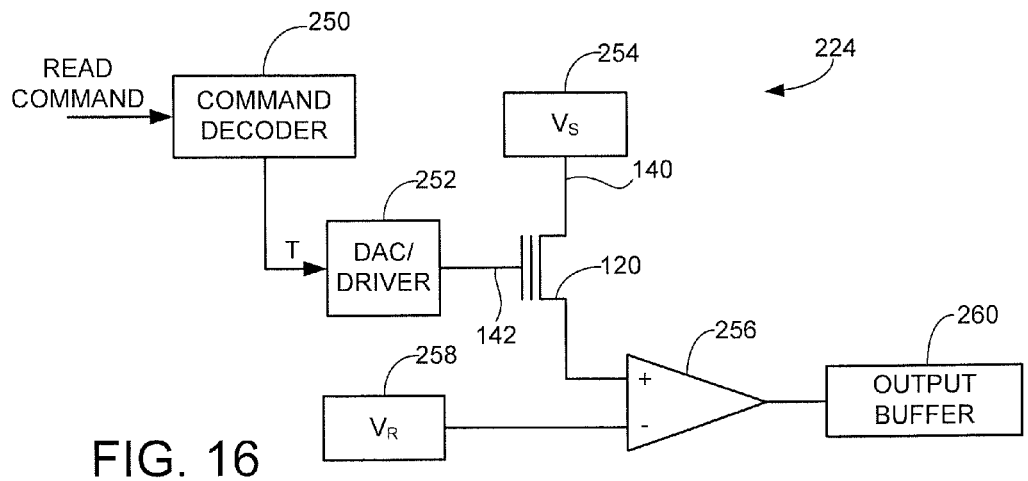
FIG. 16 is a functional block representation of the program verify block of FIG. 13.

FIG. 16 is a functional block representation of aspects of the program verify circuit 224 of FIG. 13. Other configurations can be used. The program verify circuit 224 can also be used for normal read operations upon a sequence of cells during a read operation.

A command decoder block 250 processes a read command and outputs one or more digital read threshold values T to a digital-to-analog (DAC)/driver circuit 252. The DAC/driver 252 outputs a corresponding analog gate voltage to each cell of a row of cells being read (represented by a single cell 230). A source voltage $V_s$ is applied by source 254. The conductive state of the cell is sensed using a comparator 256 and a suitable reference voltage Vr from source 258. The sensed data are provided to an output buffer 260 which outputs the sensed bit (e.g., 1 if conductive, 0 if non-conductive).

Figure 17:
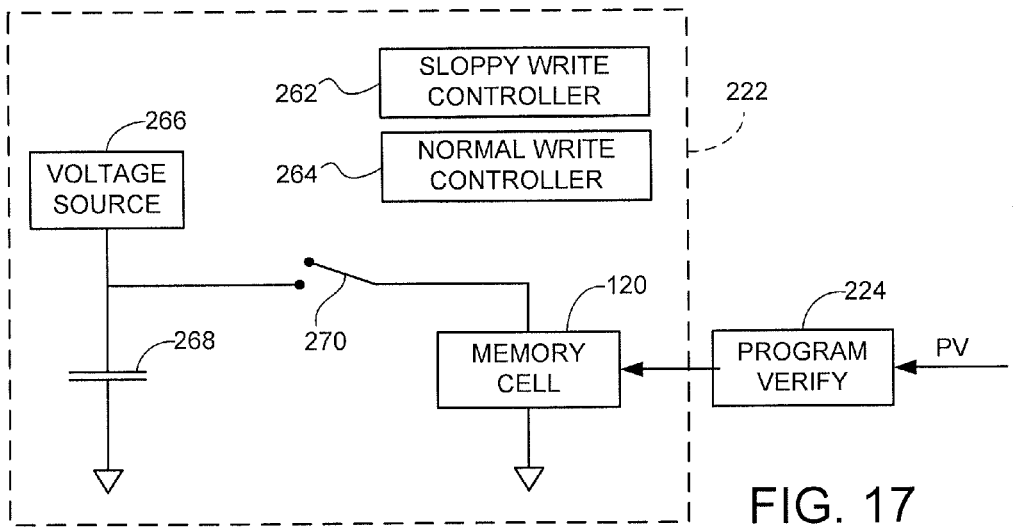
FIG. 17 shows a functional block representation of the charge pump circuit of FIG. 13.

FIG. 17 shows the program verify circuit 224 (PROGRAM VERIFY) in conjunction with aspects of the charge pump circuit 222 in accordance with some embodiments. The circuit 222 sequentially transfers discrete quanta of accumulated charge to the selected cell 120 being programmed to raise the total accumulated amount of charge to the desired programming level. The rate at which the charge is accumulated will be established by either a sloppy write controller 262 or a normal write controller 264, based on the selected write mode.

A voltage source 266 supplies one or more programming voltages to a capacitor 268 or other charge storage element. A selectively activated switch 270, which may take the form of a power MOSFET or other switching device, periodically closes to allow the transfer of the accumulated charge from the capacitor 268 to the selected memory cell 120.

The program verify circuit 224 is used to periodically apply one or more program verify (PV) read threshold voltages to the cell during the accumulation of charge. In some embodiments, the program processing of FIG. 17 continues until the cell 120 no longer becomes conductive responsive to the specified PV read threshold value, at which point the programming operation on the selected cell is terminated.

The normal write processing via controller 264 will generally tend to involve smaller increments of charge transfer, more frequent program verify operations, and tighter specifications on what is deemed to be a fully programmed cell as compared to programming control provided by the sloppy write controller 262.

It is contemplated that sloppy writes will be applied to all received data sets. However, in alternative embodiments, some types of data may be subjected to sloppy writes and other types of data may be subjected to normal writes. Parametric evaluation of different portions of the flash memory array 110 may indicate that sloppy writes are suitable for some portions and normal writes are suitable for other portions.

Figure 18:
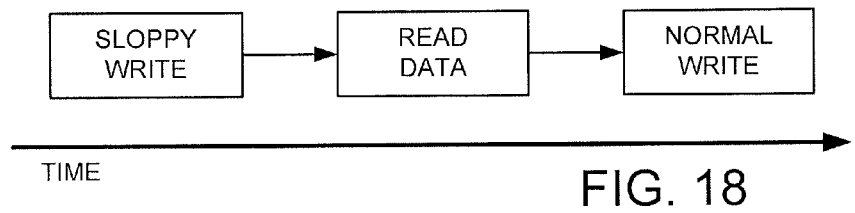
FIG. 18 is a time sequence whereby a sloppy write may be followed by a normal write at a later time.

Charge drift can occur over time due to a variety of factors, such as but not limited to adjacent writes, read disturbed data, aging, etc. It will be appreciated that the more frequently a given set of data (e.g., LBA 1001, etc.) is updated with new updated data, the less time the array 110 needs to maintain the data in a recoverable form. Accordingly, in further embodiments, some data that are written using sloppy writes may, from time to time, be read back from the flash memory array 110 and rewritten to the flash memory array using a normal write mode, as generally depicted in FIG. 18.

Figure 19:
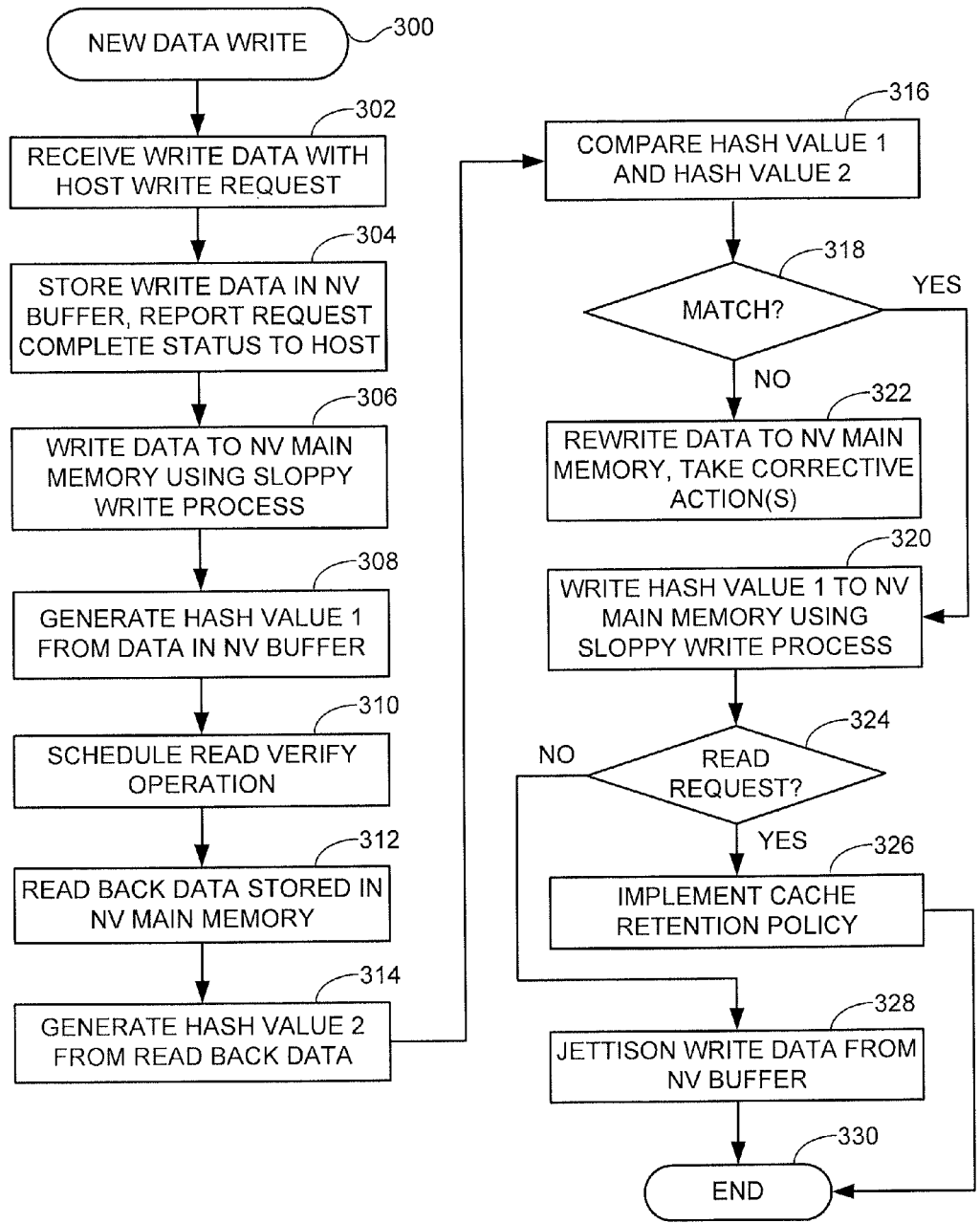
FIG. 19 provides a NEW DATA WRITE routine generally illustrative of steps carried out in accordance with some embodiments.

FIG. 19 provides a flow chart for a NEW DATA WRITE routine 300, generally illustrative of steps carried out in accordance with the foregoing discussion. Various steps shown in FIG. 19 can be altered, omitted and/or performed in a different order, and additional steps can be inserted as desired. The routine will be discussed with respect to the flow of FIG. 11 during the writing of a selected set of input write data having a selected logical address (in this case, LBA 1001 although any logical addressing can be used). It is further contemplated, albeit not necessarily required, that the first pass through the routine of FIG. 19 will involve the first writing of the selected LBA to the array 110.

A Write data with host write request (command) is received from the host at step 302. The write request may include the logical address (LBA 1001) and the associated user data to be written to the flash memory array 110. The data are temporarily stored in the NV buffer 114, step 304. As desired, writeback data processing can be employed so that the host is notified that the write process has been completed at this point.

At step 306, the write data from the NV buffer 114 are copied to the NV main memory, which in this example is the flash memory array 110. A sloppy write process is used as discussed above in FIGS. 13-18.

A first hash value (hash value 1) is generated from the write data resident in the NV buffer 114 at step 308. A read verify operation is scheduled at step 310, and when the system is ready to proceed, read data are obtained from the flash memory array 110 at step 312 and a second hash value (hash value 2) is generated from the read back data at step 314.

The two hash values (hash value 1 and hash value 2) are compared at step 316. If the two hash values match, decision step 318, the first hash value (hash value 1) is written to the NV main memory using a sloppy write process, as provided at step 320. Contrawise, if the two hash values (hash value 1 and hash value 2) do not match, the process continues to step 322 where the write data in the NV buffer 114 are rewritten to a new location in the memory. In some embodiments, this may take place using a normal write process. Other corrective actions may be taken at this time as well, which may result in the evaluation of the flash memory array 110 and the deallocation or other servicing of one or more portions thereof.

Decision step 324 determines whether a read request was received for the input write data resident in the NV buffer 114 prior to the successful completion of the write verify operation. If so, a cache retention policy may be implemented at step 326 to retain the buffered data in the NV buffer 114 for a selected period of time in anticipation of further read cache hits. Otherwise, the write data are jettisoned from the NV buffer at step 328, which may include moving the data to a replacement status so that the data may be overwritten when the associated cache entry is needed. The routine then ends at step 330.

Figure 20:
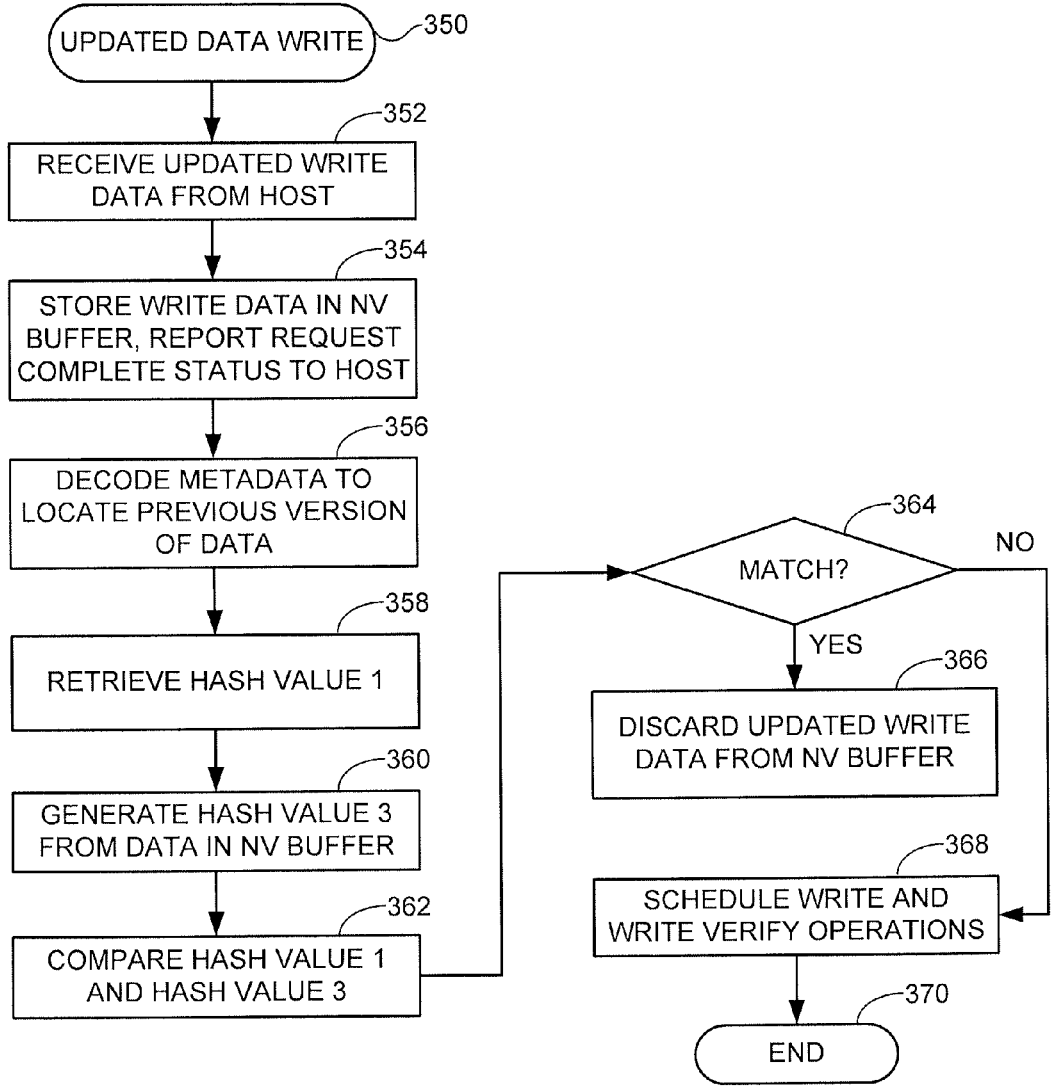
FIG. 20 provides a NEW DATA WRITE routine generally illustrative of steps carried out in accordance with some embodiments.

FIG. 20 provides a flow chart for an UPDATED DATA WRITE routine 350, generally illustrative of further steps that may be carried out in accordance with the foregoing discussion. For purposes of the present example, the following discussion of FIG. 20 will be in the context of receipt of a new set of write data from the host for the selected LBA (e.g., LBA 1001). As before, the various steps are exemplary and may be modified as required.

Updated write data for the selected LBA are received at step 352, and, as before, the data are cached in the NV buffer 114 and a command complete status is returned to the host at step 354. Metadata are decoded to locate the most previous version of the data associated with the selected LBA at step 356, and from the metadata the previously stored first hash value (hash value 1) is retrieved from the flash memory array 110 at step 358.

A third hash value (hash value 3) is generated at step 360 from the data resident in the NV buffer 114. The hash values (hash value 1 and hash value 3) are compared at step 362, and if the hash values match, step 364, the updated write data are determined to be a duplicate of the previously stored data. The data are accordingly discarded from the NV buffer and further processing is concluded.

On the other hand, if the hash values do not match, it is determined that the updated write data are different from the previously stored data, and the flow passes to step 368 where a normal write operation and a subsequent write verify operation are carried out in accordance with the flow of FIG. 19. The process then ends at step 370.

Figure 21:
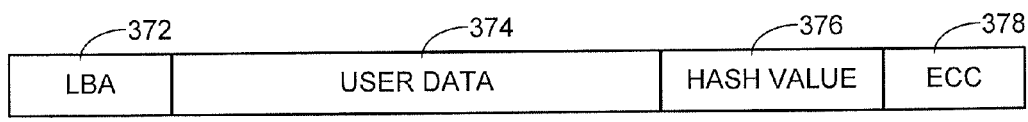
FIG. 21 is an exemplary format for data stored to the NV main memory in accordance with some embodiments.

FIG. 21 shows an exemplary format for data stored to the flash memory array 110 in accordance with some embodiments. The data may be stored along a page of memory, or a portion thereof. The data may include an LBA field 372, a user data field 374, a hash value field 376 and error correction code (ECC) field 378. As noted above, the hash value can be stored with the associated data, as in FIG. 21, or stored elsewhere in the main memory (or other suitable NV memory location).

It will now be appreciated that the various embodiments presented herein can provide a number of benefits. The use of an NV buffer to temporarily buffer input write data may help to reduce data loss in the event of power loss or other anomalous event. The use of sloppy write processing can reduce the time required to transfer the data to the NV main memory, and the use of hash values can reduce the complexity of the write verify process. Moreover, generating hash values for each set of write data can reduce write amplification by providing an efficient way to perform fast rejections of duplicate data sets.

Although not necessarily limiting, it is contemplated that a rewriteable NV buffer, such as but not limited to RRAM, STRAM, PCRAM, etc. can advantageously extend the operational performance of an NV main memory made of a different construction, such as erasable flash memory. Other types of buffer and main memory can be used.

Numerous characteristics and advantages of various embodiments of the present disclosure have been set forth in the foregoing description, together with structural and functional details. Nevertheless, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:
1. A method comprising:
storing a first set of input write data in a rewriteable non-volatile (NV) buffer, the first set of input write data having an associated logical address;
transferring a copy of the first set of input write data to an NV main memory using a sloppy write process;
performing a verify operation to verify successful transfer of the copy of the first set of input write data to the NV main memory;
generating a first hash value using a selected hash function responsive to the first set of input write data in the NV buffer, the first hash value used to verify the transfer of the copy of the first set of input write data;
generating a second hash value using the selected hash function responsive to the copy of the first set of input write data retrieved from the NV main memory;
comparing the first and second hash values; and
storing the first hash value in the NV main memory responsive to a successful write verify operation.

2. The method of claim 1, further comprising storing the first hash value in the NV main memory responsive to successful transfer of the copy of the first set of input write data to the NV main memory.

3. The method of claim 2, further comprising receiving an updated first set of input write data having the associated logical address, retrieving a copy of the stored first hash value, and comparing the retrieved copy of the stored first hash value with a third hash value generated responsive to the updated first set of input write data.

4. The method of claim 3, further comprising writing the updated first set of input write data to the NV main memory using the sloppy write process responsive to the first hash value not matching the third hash value, and jettisoning the updated first set of input write data from the NV buffer without copying the same to the NV main memory responsive to the first hash value matching the third hash value.

5. The method of claim 1, further comprising receiving a second set of input write data in the NV buffer, and writing a copy of the second set of input write data from the NV buffer to the NV main memory using a normal write process, wherein the sloppy write process programs the first set of input write data using a first set of write parameters, the normal write process uses a different second set of write parameters, and the normal write process takes longer than the sloppy write process for a same total amount of input write data.

6. The method of claim 1, in which the NV buffer is a rewriteable solid-state memory and the NV main memory is an erasable solid-state memory.

7. The method of claim 6, in which the rewriteable solid-state memory is a selected one of a spin-torque random access memory (STRAM), a resistive random access memory (RRAM) or a phase change random access memory (PCRAM).

8. The method of claim 6, in which the erasable solid-state memory is a flash memory array.

9. The method of claim 1, in which the NV buffer is a rewriteable solid-state memory comprising a selected one of a spin-torque random access memory (STRAM), a resistive random access memory (RRAM) or a phase change random access memory (PCRAM), and the NV main memory comprises an erasable flash memory array.

* * * * *